US006960784B2

(12) United States Patent
Lin et al.

(10) Patent No.: US 6,960,784 B2
(45) Date of Patent: Nov. 1, 2005

(54) CHARGING SENSOR METHOD AND APPARATUS

(75) Inventors: Wallace W. Lin, San Jose, CA (US); George E. Sery, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 119 days.

(21) Appl. No.: 10/465,741

(22) Filed: Jun. 18, 2003

(65) Prior Publication Data

US 2004/0256642 A1 Dec. 23, 2004

(51) Int. Cl.[7] ........................................ H01L 23/58

(52) U.S. Cl. ........................ 257/48; 257/288; 257/356; 257/360

(58) Field of Search .......................... 257/48, 288, 355, 257/356, 360

(56) References Cited

U.S. PATENT DOCUMENTS

| | | | | |
|---|---|---|---|---|
| 5,781,445 | A * | 7/1998 | Shiue et al. | 702/57 |
| 6,091,113 | A * | 7/2000 | Tanaka | 257/355 |
| 6,265,729 | B1 * | 7/2001 | Nelson et al. | 257/48 |
| 6,747,303 | B2 * | 6/2004 | Schroeder | 257/296 |

* cited by examiner

*Primary Examiner*—Gene M. Munson
(74) *Attorney, Agent, or Firm*—Schwabe, Williamson & Wyatt, P.C.

(57) ABSTRACT

A charging sensor is provided to detect charging signal during the manufacturing process of integrated circuits and various semiconductor devices. In one embodiment, the charging sensor includes a charging-sensitive insulator layer and complementary elements designed to effectively provide an indicative potential drop across the charging sensitive insulator.

28 Claims, 4 Drawing Sheets

CHARGING SENSOR METHOD AND APPARATUS

FIELD OF THE INVENTION

The present invention relates to integrated circuits, and more particularly to a sensor method and apparatus for detecting charging during an integrated circuit manufacturing process.

BACKGROUND OF INVENTION

Trends in the design and manufacture of microelectronic dies, or integrated circuits (ICs), are toward increasing miniaturization, circuit density, robustness, operating speeds and switching rates, while reducing power consumption and defects in the ICs. ICs are made up of a tremendous number (e.g., millions) of devices (e.g., transistors, diodes, capacitors), with each component being made up of a number of delicate structures, manufactured through a number of process steps. As IC manufacturing technology continues to evolve and the manufacturing of smaller sized components and more compact ICs become reality, the delicate structures likewise become smaller, more compact, and correspondingly, more delicate.

Because of the delicate nature of these components, and because of the significant number of processing steps the IC can undergo during manufacturing (e.g. ion implantation, plasma etching, diffusion, etc.) a great potential exists for damage to these components. This in turn leads to defects and the potential failure of the IC.

One or more of the IC manufacturing stages involve plasma related processes. Plasma related process include, but are not limited to metal etch, interlayer dielectric etch, via etch and the like. Plasma related processing may lead to electrical charging of exposed IC structures (e.g., metallic lines), which in turn can damage to the aforementioned delicate structures on the wafer, e.g., through excessive charge build-up, and then subsequent electrical discharge.

A few techniques have been used to estimate the charge resulting from the manufacturing process, including the use of a separate electrically erasable programmable read only memory (EEPROM) transistor that is placed in the processing chamber to sense the induced charge that may result from plasma related processing of the ICs. These current sensors have a number of deficiencies. The EEPROM sensors are not native to the process in which it is used to monitor. Rather, it is fabricated in a different process. Further, it is not typically located on the wafer being processed. The EEPROM sensors thus cannot sense the maximum charging signal as seen by the gate oxide in the MOSFETs located on the wafer being processed.

Moreover, the EEPROM sensor can only monitor for a brief period, then it must be pulled from the chamber and separately analyzed, which is ultimately time and resource consuming. Finally, inserting and removing the EEPROM sensor from the processing chamber creates the unnecessary potential for contamination of the process and equipment.

To minimize damage from excessive charge build up and discharge, it would be advantageous to monitor the ICs during the manufacturing process to determine the actual charging signal as seen by the gate oxide layer (in a MOSFET) or other delicate structures. A high charging signal will result in an abnormal degradation of the gate oxide layer (in a MOSFET), which in turn will result in undesirable gate leakage and a defective IC. Detecting the charging signal enables one to evaluate and make corrective modifications to equipment, recipes, materials, and other components of the IC manufacturing process (e.g. contamination, excessive exposure, etc.).

A real time sensor method and apparatus is therefore needed. Preferably, it can detect the maximum charge signals induced by the IC manufacturing processes under the precise conditions and recipes as the ICs being produced in the process. A charging sensor is also needed that can not only detect the charging signal over the entire charging-sensitive insulator (e.g. gate oxide), but also locally at the various regions of the charging-sensitive insulator where there is overlap with active regions of the substrate active body (e.g. the overlap region between either the source, drain or channel and the gate oxide in the case of a MOSFET).

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Figure 1:
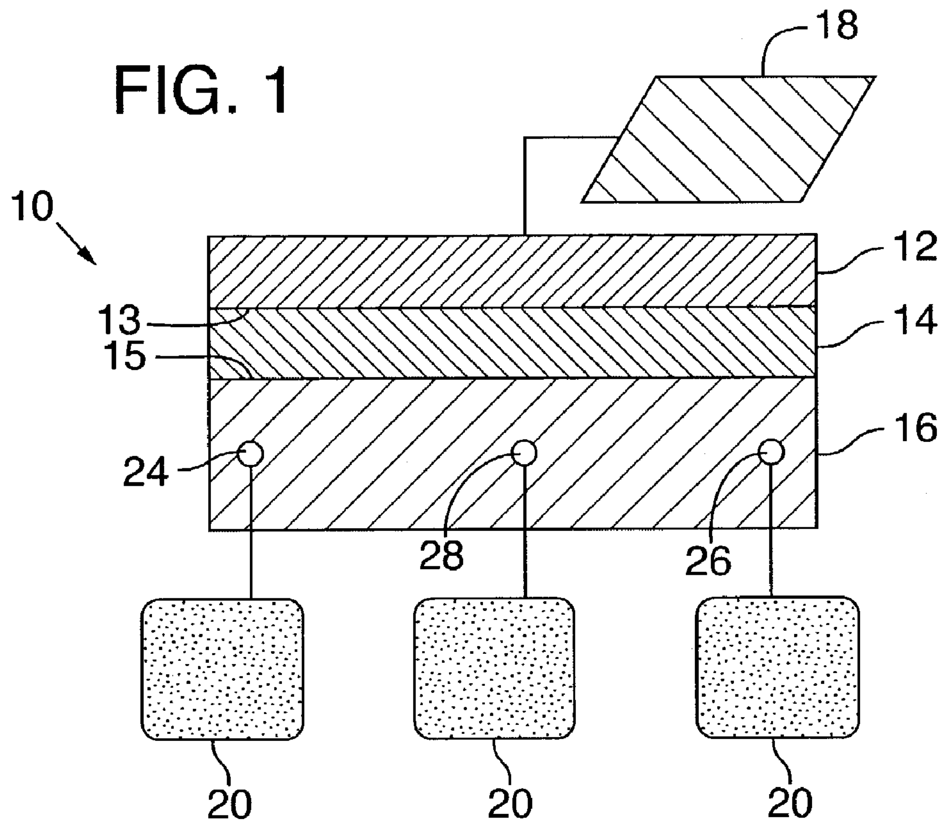
FIG. 1 is a side cross sectional view of a charging sensor in a semiconductor device in accordance with one embodiment of the present invention.

FIG. 1 is a side cross sectional view of a charging sensor 10 applied to a general semiconductor device in accordance with one embodiment of the present invention. For the embodiment, the sensor 10 comprises three layers, control gate 12, charging sensitive insulator14, and substrate active body 16, which may include one or more active regions that are at least partially overlapped by charging sensitive insulator 14.

Charging sensitive insulator 14 has a first side 13 and a second side 15. Control gate 12 is positioned adjacent to or is coupled to charging sensitive insulator 14 at first side 13. Substrate active body 16 is adjacent to or in communication with charging sensitive insulator 14 at second side 15.

Control gate 12 may be formed employing any conductive material, such as metal, including but not limited to Copper, Aluminum, Gold, and the like, or a conductive non-metal, including, but not limited to polysilicon. Charging sensitive insulator 14 may be formed employing any charging sensitive material, including but not limited to Silicon Dioxide, Nitride, Oxinitride. Substrate active body 16 may be a semiconductive layer, which includes, but is not limited to a Silicon, Germanium, a Silicon Germanium, and a Gallium Arsenide layer.

As will be described in more details below, under the present invention, the charging signal induced by a plasma related process and as seen by the charging sensitive insulator 14, in particular, relatively thicker charging sensitive insulator, may be advantageously detected by measuring the threshold voltage of the charging sensor of the semiconductor device or by measuring the breakdown voltage of the charging sensitive insulator layer 14. Further, the charging signal induced by a plasma related process and as seen by the charging sensitive insulator 14, in particular, relatively thinner charging sensitive insulator, may be advantageously detected by measuring leakage current in the charging sensitive insulator layer 14. A high charging signal (i.e. high voltage shift or current leakage) gives the warning that a problem may be surfacing up in the back-end process and modifications may be necessary.

Detecting the charging signal seen by the charging sensitive insulator 14, including a maximum charging signal, may be advantageously achieved by creating an indicative (relatively high or maximum) potential on one side of the charging sensitive insulator 14 and a complementary indicative (relatively low or minimum) potential on the other side of charging sensitive insulator 14.

As shown in FIG. 1, a relatively high potential is created on the first side 13 of charging sensitive insulator 14 by electrically interconnecting an interconnect feature 18 to the control gate 12. Interconnect feature 18 may be formed employing any conductive material, including but not limited to metal, such as copper. Further, it may assume any one of a number of shapes, depending on the particular plasma related process being used. Preferably, the materials and/or the shape efficiently contribute to the high absorption of charges.

Figure 6A:
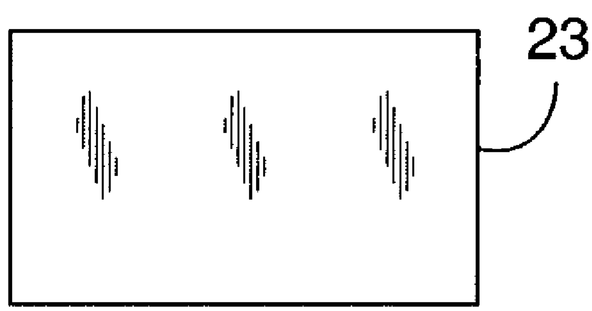
FIG. 6A is a top view of an interconnect feature in accordance with one embodiment of the present invention.
Figure 6B:
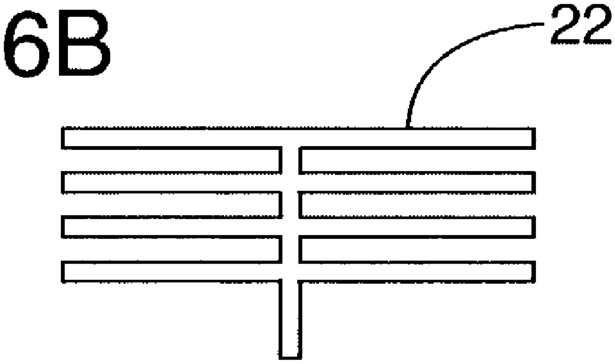
FIG. 6B is a top view of an interconnect feature in accordance with one embodiment of the present invention.

FIGS. 6A and 6B are top views of two interconnect features in accordance with two embodiments of the present invention. FIG. 6A shows an area intensive metal plate 23. FIG. 6B shows an edge intensive dense array of interconnected metal lines 22, preferably having a narrow width, and spacing.

In one embodiment, the large conductive plate 23 of FIG. 6A is advantageously employed during an interlayer dielectric etch related plasma process to achieve relatively high and sustained potential, either at the control gate or control electrode, depending on where conductive plate 23 is connected. The relatively high and sustained potential is achieved due to the high area metal to substrate impedance.

In another embodiment, the dense array of metal lines 22 of FIG. 6B is advantageously employed during the metal etch related plasma process to achieve a relatively high and sustained potential at either the control gate or the control electrode where it is connected. The relatively high and sustained potential is achieved due to the long edge periphery length of the metal lines, and because plasma charges are absorbed through the edge of the metal lines during metal-etch related plasma process.

In yet another embodiment, the dense array of metal lines is advantageously employed to sustain a high potential at either the control gate or the control electrode, depending on where it is connected, during the interlayer dielectric etch related plasma process. The desired result is achieved due to the high fringing metal to substrate impedance.

It can be appreciated, however, that other embodiments of interconnect features may be used, or a combination of conductive materials and shapes, depending on the plasma related process being used and the required absorbing characteristics.

In various embodiments, with interconnect feature 18 creating a relatively high potential on the first side 13 of charging sensitive insulator 14, to achieve the indicative (maximum) potential drop across the charging sensitive insulator 14, the potential is pulled down to a complementary indicative (minimum) level on the second side 15. More specifically, a potential reducing feature 20 may be electrically interconnected to control electrodes 24, 26, 28. Control electrodes 24, 26, 28 may be electrically interconnected to the active regions of substrate active body 16 that are overlapped by the charging sensitive insulator 14.

As discussed in greater detail with respect to FIG. 4, which illustrates application of the charging sensor of the present invention to a MOSFET, the active regions of the substrate active body may include, but are not limited to, a source region, a drain region, and a channel region disposed in between the source and the drain regions. The number of control electrodes is not limited, and may correspond to as many different active regions as are present in the substrate active body 16.

Figure 5:
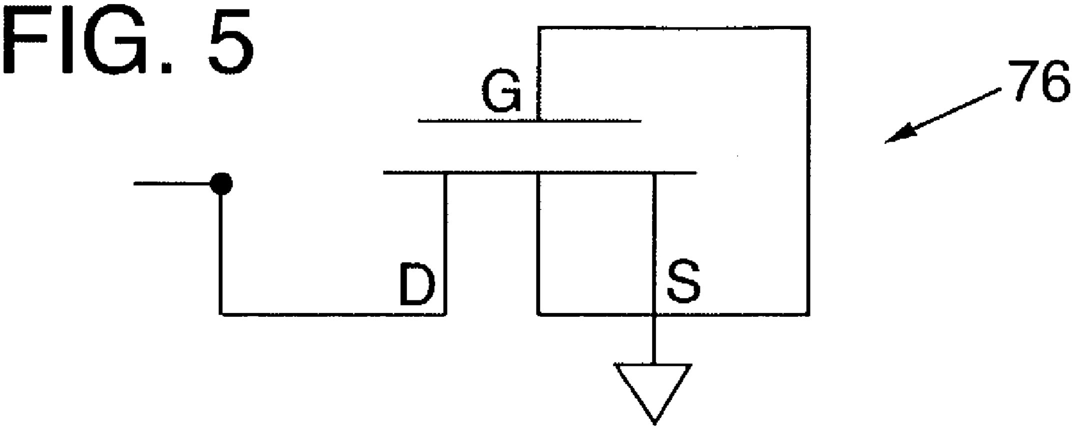
FIG. 5 is a schematic diagram of a high leakage device in accordance with one embodiment of the present invention.

Potential reducing feature 20 may be any device equipped to pull down the electrical potential, to increase or relatively "maximize" the potential drop across charging sensitive insulator 14. FIG. 5 shows an example of a high leakage device 22 that is an n-type metal-oxide-semiconductor (NMOS) gated diode. Another embodiment of a potential reducing feature is where the control electrodes are electrically interconnected to a substrate ground (not shown) in order to reduce or relatively "minimize" the potential on the opposite side of the charging sensitive insulator 14.

With interconnect feature 18 electrically interconnected to the control gate 12 and potential reducing feature 20 electrically interconnected to control electrodes 24, 26, 28, the indicative (relatively high or maximum) potential is created on the first side 13 and the complementary indicative (relatively low or minimum) potential is created on the second side 15 of charging sensitive insulator 14. The charging signal as seen by the entire charging sensitive insulator 14 can thus be detected as a result of the corresponding potential drop across the charging sensitive insulator 14 (e.g. voltage or leakage current associated with the charging sensitive insulator layer).

Figure 2:
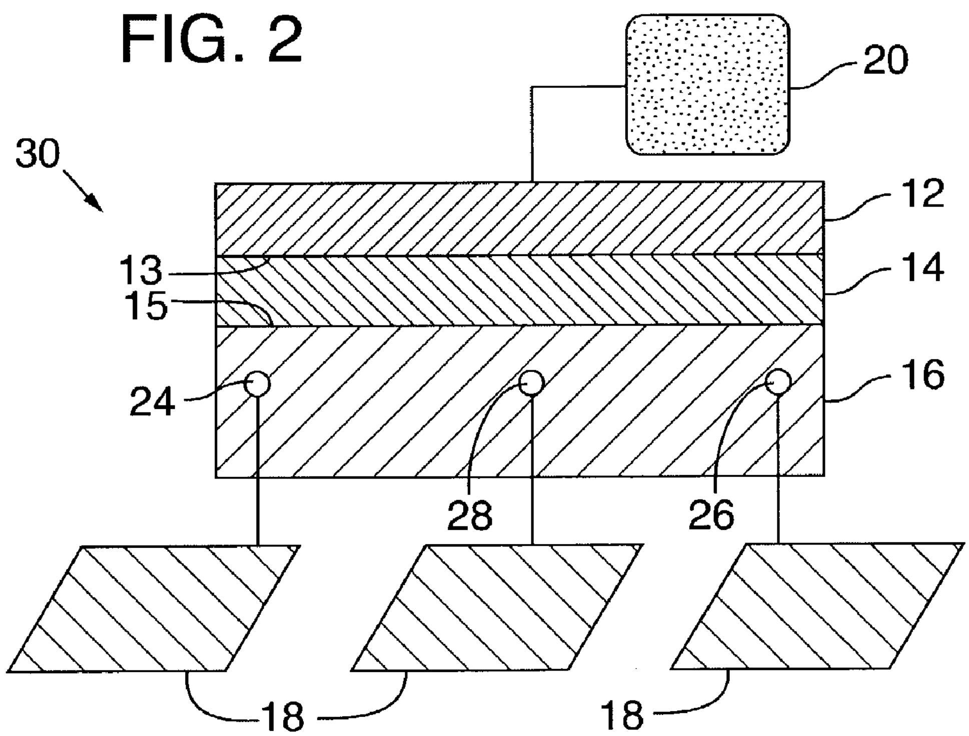
FIG. 2 is a side cross sectional view of a charging sensor in a semiconductor. device in accordance with another embodiment of the present invention.

FIG. 2 is a side cross sectional view of a charging sensor 30 applied to a general semiconductor device in accordance with another embodiment of the present invention. For this embodiment, charging sensor 30 is also comprised of three layers, control gate 12, charging sensitive insulator 14 and substrate active body 16. The materials for these layers can be those identified above in reference to FIG. 1.

Additionally, high leakage device 20 is electrically interconnected to control gate 12, which reduces the potential on the first side 13 of charging sensitive insulator 14 to a relatively low level. Likewise, interconnect features 18 are electrically interconnected to control electrodes 24, 26 and 28, thereby creating a relatively high and sustained potential on the second side 15 of charging sensitive insulator 14.

As discussed with regard to FIG. 1, the number of control electrodes 24, 26, 28 is not limited to those shown, but is dependent upon the number of active regions that may be present in a substrate active body of a particular device.

Charging sensors 10, 30 applied to a general semiconductor device, as shown in FIGS. 1 and 2 have substantial improvements over the current sensing methods and devices discussed in the background section. For example, sensors 10, 30 may be applied in situ, such as on one or more test dies in a processed wafer. This has the benefit of sensing the charges induced by the processing steps to the actual dies themselves, as well as being real time in the sense that the sensor can undergo all the processing steps of all the dies in that process. Thus, sensors 10, 30 more accurately detect charging signal resulting from the charges absorbed by the metal lines, control gate, and other structures, which may cause degradation of the charging sensitive insulator 14. Further, since the sensors 10, 30 are in situ, the risk of unnecessary contamination is reduced, as the processing chamber needs not be breached at any time during the process.

In other embodiments not shown, it can be appreciated by one skilled in the art that other layers may be interposed between the control gate and the insulator, or between the charging sensitive insulator and the substrate. The presence of such layers does not affect the charging sensor of the present invention, in that the charging signal seen by the charging sensitive insulator will still be detected by creating an indicative (relatively high or maximum) potential on one side of the charging sensitive insulator and a complementary indicative (relatively low or minimum) potential on the other side of the insulator.

Figure 3:
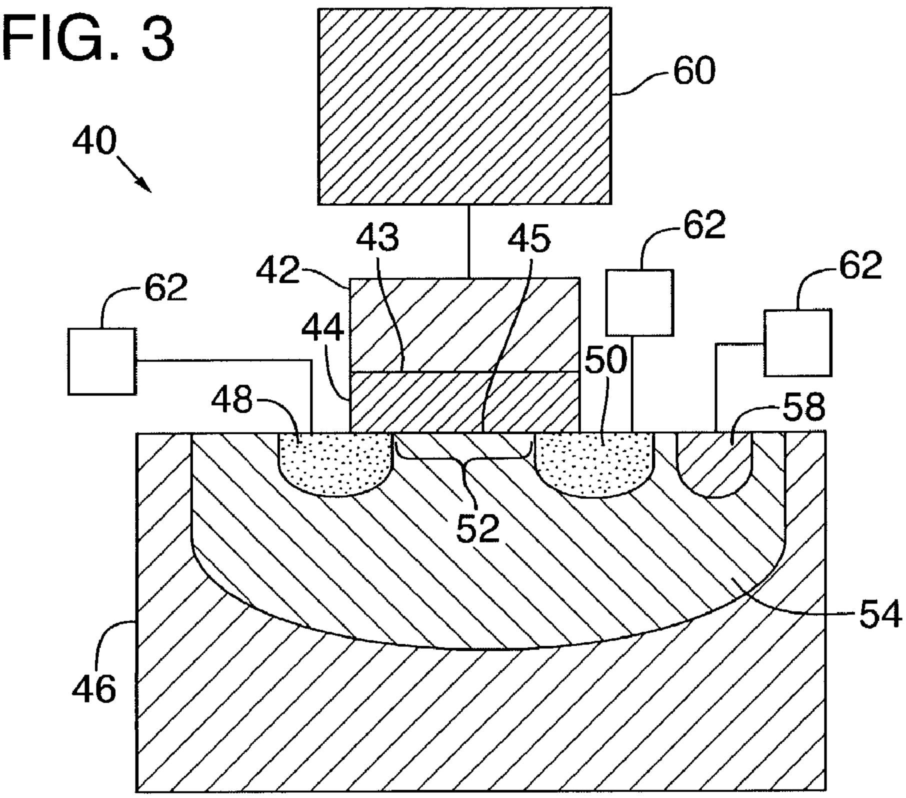
FIG. 3 is a side cross sectional view of a charging sensor applied to a p-type MOSFET in accordance with one embodiment of the present invention.

FIG. 3 is a side cross sectional view of a charging sensor applied to a MOSFET. A polysilicon control gate 42 is coupled to with the first side 43 of gate oxide layer 44, which is the charging-sensitive insulator layer as discussed with regard to the general applications of FIGS. 1 and 2. Substrate active body 46 of a particular substrate (not shown) includes well 54, source region 48, and drain region 50 and channel region 52 that is between source region 48 and drain region 50.

Substrate active body 46 is coupled to the second side 45 of gate oxide 44. Gate oxide 44 covers at least a portion of the substrate active body 46. Particularly, gate oxide 44 covers a portion of source region 48, all of channel region 52 of well 54 and a portion of drain region 50. The MOSFET of charging sensor 40 could either be a p-type MOSFET, in which case source 48 and drain 50 would be p-type, or it could be an n-type MOSFET, in which case source 48 and drain 50 would be n-type.

To sense the indicative charging signal seen by the gate oxide layer 44 on a global basis (across the entire gate oxide of the particular transistor), an interconnect feature 60, as described with respect to FIGS. 1 and 2, is electrically interconnected to the polysilicon control gate 42 to absorb charges in order to create the indicative (relatively high or maximum) potential on the first side 43 of gate oxide layer 44. To create the complementary indicative (relatively low or minimum) potential on the second side 45 of gate oxide layer 44, a potential reducing feature 62, as described with respect to FIGS. 1 and 2, are electrically interconnected to the source 48 and drain 50.

Potential reducing feature 62 is also electrically interconnected to channel 52 through well tap 58, such that the complementary indicative (relatively low or minimum) potential is created across the entire gate oxide layer 44 on the second side 45. In this configuration, charging sensor 40 advantageously detects the charging signal resulting from the indicative potential drop globally across the entire gate oxide layer 44.

In another embodiment, though not shown, the potential reducing feature 62 can be electrically interconnected to the polysilicon control gate 42 in order to create the indicative (relatively low or minimum) potential on the first side 43 of gate oxide layer 44. Likewise, interconnect features 60 may be electrically interconnected to the source 48, drain 50 and channel 52 in order to create the indicative (relatively high or maximum) potential on the second side 45 of gate oxide layer 44, which in turn enables the detection of the charging signal seen by the entire gate oxide layer 44.

It can be appreciated by one skilled in the art that the charging sensors described above work regardless of whether the semiconductor device experiences positive or negative potential at its electrodes during plasma processes.

Figure 4A:
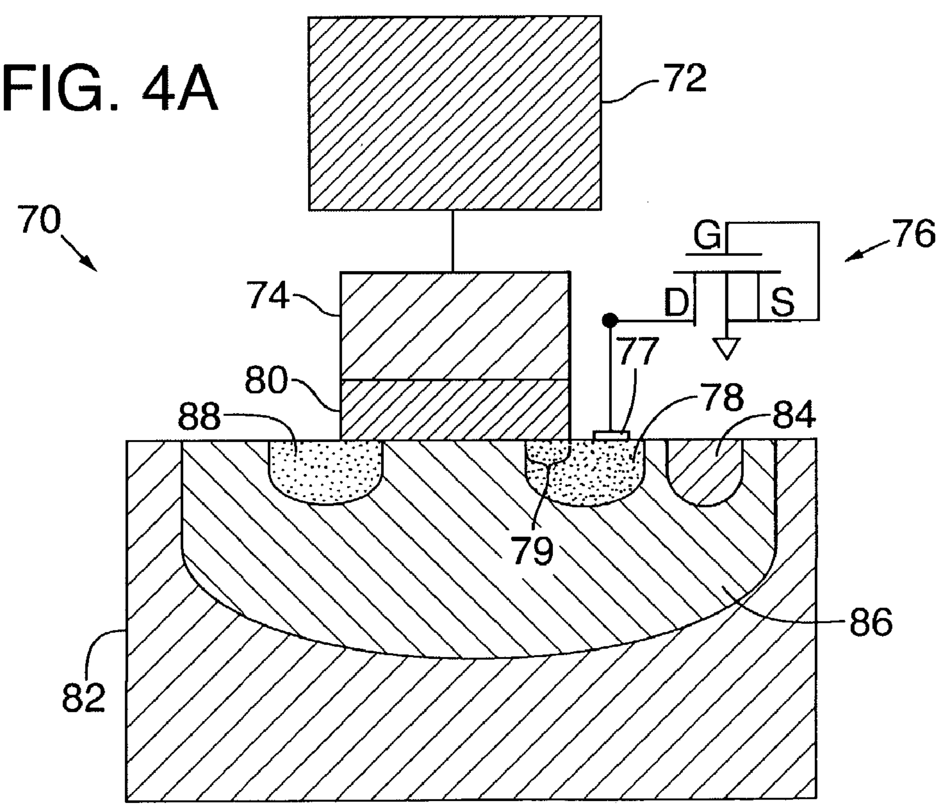
FIGS. 4A–C are side cross sectional views of a charge monitor in accordance with another embodiment of the present invention.
Figure 4B:
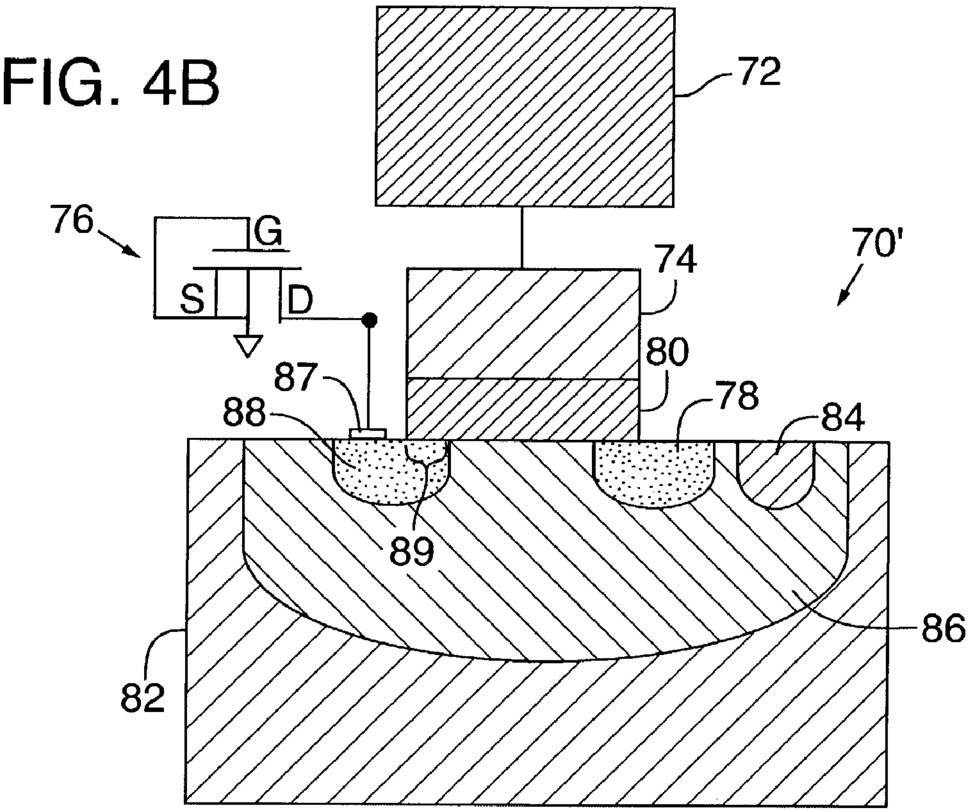
Figure 4C:
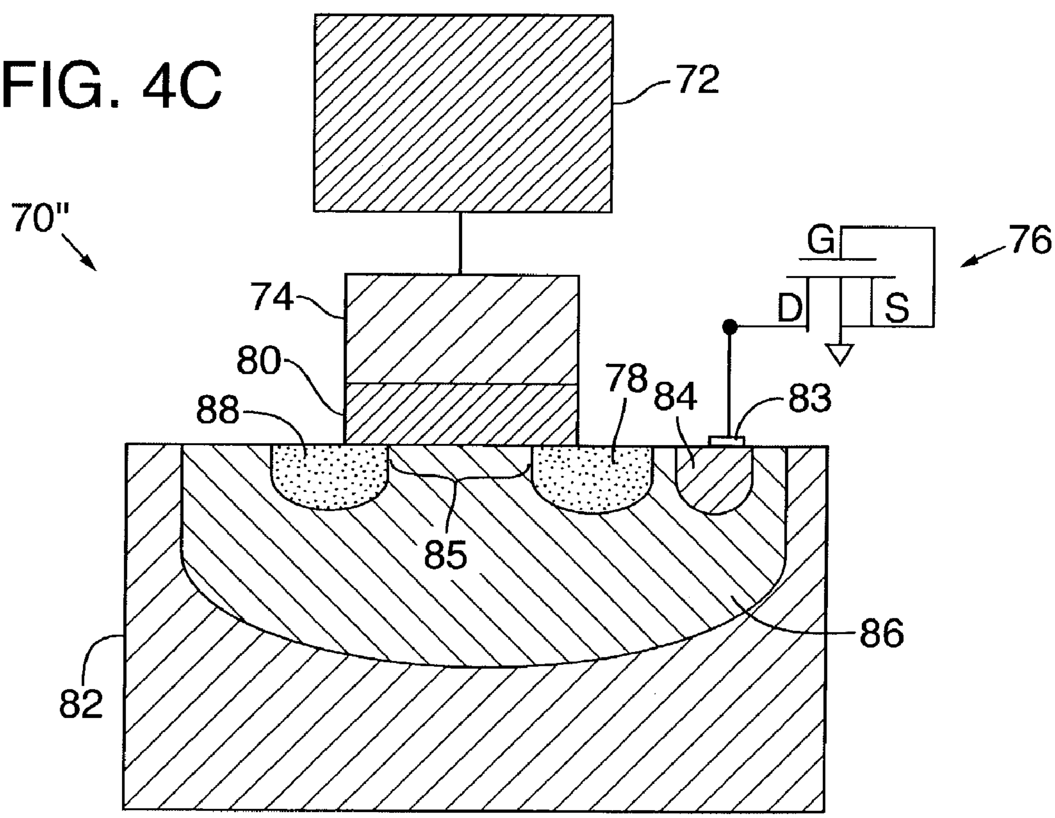

In addition to global charging detection, the charging sensors described above can also detect the charging signal locally, as seen by only certain portions of the charging-sensitive insulator layer. By way of example, the local sensing of the charge signal seen by the charging sensitive insulator is illustrated in FIGS. 4A–4C with respect to a MOSFET device. As with global sensing, however, the local sensor can be applied to a generic semiconductor device as described in FIGS. 1 and 2.

FIGS. 4A–4C are side cross sectional views of an example charging sensor applied to a MOSFET of a certain conductivity type. In FIG. 4A, an interconnect feature 72 is electrically interconnected to control gate 74. A high leakage device 76 (shown to be a gated diode as described in FIG. 5) is electrically interconnected to a control electrode 77 of a source region 78. In this configuration, the charging sensor 70 will detect locally the charging signal across the portion 79 of gate oxide layer 80 that overlaps the source region 78, as a result of the indicative (relatively high or maximum) voltage drop across that portion. Though shown with a high leakage device 76 as the potential reducing feature, any potential reducing feature can be used, including electrical interconnection with a substrate ground (e.g. the control electrode 77 of a source region 78 is connected to the substrate 82).

FIG. 4B is like FIG. 4A, except high leakage device 76 (NMOS gated diode) is electrically interconnected to a control electrode 87 of drain 88, which enables the sensor 70' to detect the charging signal across the overlapped portion 89 of the gate oxide layer 80 that is directly above the drain 88, as a result of the indicative potential drop across that portion. Similarly, in FIG. 4C, the high leakage device 76 is electrically interconnected to a control electrode 83 of well tap 84, which is in electrical communication with well 86 such that the maximum charging signal can be detected locally across the overlapped portion 85 (channel region) of the gate oxide layer 80. Though FIGS. 4A–4C show the potential reducing feature as a high leakage device, any other potential reducing feature, including, but not limited to, the substrate ground, could be used to minimize the potential on a particular side of the gate oxide layer, either locally or globally.

It can be appreciated by one skilled in the art, however, that the charge signal seen by particular areas of gate oxide layer 80 can be detected by switching the interconnect feature and the particular potential reducing feature (e.g. high leakage device or interconnection to the substrate ground), such that the potential reducing feature is electrically interconnected to the control gate 74 and the interconnect feature is electrically interconnected to either the source 78, drain 88, or well tap 84 in order to locally detect the voltage drop across a portions 79, 89, 85 respectively of the gate oxide layer 80.

Though the forgoing illustrative embodiments have been described with regard to one transistor of a semiconductor device, it can be appreciated by one skilled in the art that the same sensor can be applied to multiple transistors in the same IC or on the same die. Likewise it can be appreciated that there may be more layers than those shown, depending on the type of semiconductor device. Finally, though it has been shown that each control electrode is electrically interconnected to a different high leakage device or interconnect feature, it can be appreciated that a single high leakage device or interconnect feature may be interconnected to any one or all the control electrodes.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A charging sensor, comprising:

a charging sensitive insulator having a first side and a second side;

a control gate coupled to the first side;

a substrate active body coupled to the second side, the substrate active body having an active region overlapped by at least a portion of the charging sensitive insulator, and a control electrode electrically interconnected to the active region;

an interconnect feature electrically interconnected to the control gate; and a potential reducing feature electrically interconnected to the control electrode, the potential reducing feature being a high leakage device.

2. The charging sensor of claim 1, wherein the substrate active body further comprises:

a plurality of additional active regions; and a plurality of additional control electrodes, each additional control electrode being electrically interconnected to a corresponding one of the plurality of additional active regions.

3. The charging sensor of claim 2, wherein the plurality of active regions include a source region and a drain region, and a channel region between the source region and drain region.

4. The charging sensor of claim 2, wherein the potential reducing feature is electrically interconnected to only one of the plurality of the control electrodes.

5. The charging sensor of claim 2, wherein each control electrode is electrically interconnected to a potential reducing feature.

6. The charging sensor of claim 1, wherein the interconnect feature is a conductive plate having a defined area.

7. The charging sensor of claim 1, wherein the interconnect feature is an array of electrically interconnected conductive elements.

8. The high leakage device of claim 1, wherein the high leakage device is a n-type metal-oxide-semiconductor gated diode.

9. The charging sensor of claim 1, wherein the potential reducing feature is a substrate ground.

10. A charging sensor, comprising:

a charging sensitive insulator having a first side and a second side;

a control gate coupled to the first side;

a substrate active body in communication with the second side, the substrate active body having an active region overlapped by at least a portion of the charging sensitive insulator, and a control electrode electrically interconnected to the active region;

a potential reducing feature electrically interconnected to the control gate, the potential reducing feature being a gated diode; and an interconnect feature electrically interconnected to the control electrode.

11. The charging sensor of claim 10, further comprising:

a plurality of additional active regions; and a plurality of additional control electrodes, each additional control electrode being electrically interconnected to a corresponding one of the plurality of additional active regions.

12. The charging sensor of claim 11, wherein the plurality of active regions include a source region and a drain region of a different conductivity type than the substrate, and a channel region of the same conductivity of the substrate and that is between the source region and drain region.

13. The charging sensor of claim 11, wherein the interconnect feature is electrically interconnected to only one of the plurality of the control electrodes.

14. The charging sensor of claim 11, wherein each control electrode is electrically interconnected to an interconnect feature.

15. The charging sensor of claim 10, wherein the interconnect feature is a conductive plate having a defined area.

16. The charging sensor of claim 10, wherein the interconnect feature is an array of electrically interconnected conductive elements.

17. The potential reducing feature of claim 10, wherein the gated diode is a n-type metal-oxide-semiconductor gated diode.

18. The charging sensor of claim 10, wherein the potential reducing feature is a substrate ground.

19. A method for sensing the charge induced during the semiconductor device manufacturing processing, comprising:

electrically interconnecting an interconnect feature to a control gate of a semiconductor device for absorbing charges to create a high electrical potential on a first side of the charging sensitive insulator of the semiconductor device;

electrically interconnecting a potential reducing feature to at least one control electrodes to create a low electrical potential on a second side of the charging sensitive insulator;

exposing at least a portion of the semiconductor device, interconnect feature and potential reducing feature to a plasma related process; and measuring a charging signal by measuring a voltage associated with the charging sensitive insulator, the measuring of the voltage associated with the charging signal includes measuring breakdown voltage across the charging sensitive insulator.

20. The method of claim 19, wherein measuring the voltage associated with the charging sensitive insulator comprises measuring the threshold voltage of the semiconductor device containing the charging sensitive insulator layer.

21. The method of claim 19, wherein measuring the charging signal comprises measuring the leakage current across the charging sensitive insulator.

22. The method of claim 19, further comprising electrically interconnecting said at least one control electrode to a potential reducing feature.

23. The method of claim 19, wherein the at least one control electrode is coupled to or located in an active region, and the method further comprising forming the active region, the formed active region being selected from the group consisting of a source region, a drain region, and a channel region.

24. A method for sensing charging induced during a semiconductor device manufacturing processing, comprising:

electrically interconnecting a potential reducing feature to a control gate of a semiconductor device to create a low electrical potential on a first side of a charging sensitive insulator of the semiconductor device;

electrically interconnecting an interconnect feature to at least one control electrodes to create a high electrical potential on a second side of the charging sensitive insulator;

exposing at least a portion of the semiconductor device, interconnect feature and potential reducing feature to a plasma related process; and measuring a charging signal, the measuring of the charging signal comprises measuring the breakdown voltage across the charging sensitive insulator I.

25. The method of claim 24, wherein measuring a charging signal comprises measuring the threshold voltage of the semiconductor device containing the charging sensitive insulator layer.

26. The method of claim 24, wherein measuring the charging signal comprises measuring the current leakage across the charging sensitive insulator.

27. The method of claim 24, further comprising electrically interconnecting the at least one control electrode to an interconnect feature.

28. The method of claim 24, wherein the at least one control electrode is coupled to or located in an active region, and the method further comprising forming the active region, the formed active region being selected from the group consisting of a source region, a drain region, and a channel region.

* * * * *

UNITED STATES PATENT AND TRADEMARK OFFICE

CERTIFICATE OF CORRECTION

PATENT NO. : 6,960,784 B2
APPLICATION NO. : 10/465741
DATED : November 1, 2005
INVENTOR(S) : Lin et al.

It is certified that error appears in the above-identified patent and that said Letters Patent is hereby corrected as shown below:

Column 4
Lines 31-32, "...high leakage device 22..." should read --...high leakage device 76...--.
Line 57, "...high leakage device 20..." should read --...potential reducing feature 20...--.

Column 8
Line 55, "...one control electrodes,..." should read --...one control electrode...--.

Column 9
Lines 24-25, "...least one [New Line] control..." should read --...least one control...--.
Lines 24-25, "...one control electrodes..." should read --...one control electrode...--.

Signed and Sealed this

Eighth Day of July, 2008

Jon W. Dudas

JON W. DUDAS
*Director of the United States Patent and Trademark Office*